US011567233B2

(12) United States Patent
Zhu et al.

(10) Patent No.: US 11,567,233 B2
(45) Date of Patent: Jan. 31, 2023

(54) NUMERICAL SIMULATION AND PARAMETER OPTIMIZATION METHOD FOR VOLUMETRIC FRACTURING OF UNCONVENTIONAL DUAL MEDIUM RESERVOIR

(71) Applicant: CHENGDU UNIVERSITY OF TECHNOLOGY, Chengdu (CN)

(72) Inventors: Haiyan Zhu, Chengdu (CN); Qingyou Liu, Chengdu (CN); Yapu Zhao, Chengdu (CN); Yang Li, Chengdu (CN)

(73) Assignee: CHENGDU UNIVERSITY OF TECHNOLOGY, Chengdu (CN)

( * ) Notice: Subject to any disclaimer, the term of this patent is extended or adjusted under 35 U.S.C. 154(b) by 769 days.

(21) Appl. No.: 16/516,261

(22) Filed: Jul. 19, 2019

(65) Prior Publication Data

US 2020/0301043 A1 Sep. 24, 2020

(30) Foreign Application Priority Data

Mar. 22, 2019 (CN) .......................... 201910223536.2

(51) Int. Cl.
*G01V 99/00* (2009.01)
*G06F 30/20* (2020.01)

(52) U.S. Cl.
CPC .............. *G01V 99/005* (2013.01); *G06F 30/20* (2020.01)

(58) Field of Classification Search
CPC ......... G01V 99/005; G01V 2210/1234; G01V 2210/00; G01V 2210/60; G01V 2210/64; G01V 2210/646; G06F 30/20; G05B 23/0254; G05B 23/02343; G05B 2219/37205; G05B 19/4202; G05B 19/4207; G05B 2219/32104; G01N 29/4472; G01N 2203/006; G01N 2203/0067; F05D 2270/71;

(Continued)

(56) References Cited

FOREIGN PATENT DOCUMENTS

| CN | 105201479 B | * | 10/2017 | |
|----|-------------|---|---------|---|
| CN | 107705215 A | * | 2/2018 | ....... G06Q 10/06393 |
| CN | 108442911 A | * | 8/2018 | ............ E21B 43/26 |

* cited by examiner

*Primary Examiner* — Daniel R Miller
*Assistant Examiner* — Eric Sebastian Von Wald
(74) *Attorney, Agent, or Firm* — Bayramoglu Law Offices LLC

(57) ABSTRACT

A numerical simulation and parameter optimization method for volumetric fracturing of an unconventional dual medium reservoir includes the following steps: based on the theory of dual-medium pore elasticity, in consideration of the friction effect between fractures, developing a viscoelastic-plastic damage model of hydraulic fractures based on explicit time integral; simulating random intersection and bifurcation of hydraulic fractures encountering with natural fractures by adopting a method of embedding zero-thickness fracture units in the inner boundaries of computational model grids, and establishing a mathematical model of hydraulic fracture expansion of volumetric fracturing in the unconventional dual-medium reservoir; compiling a finite element program for complex multi-fracture fracturing and competitive expansion during volumetric fracturing of the unconventional reservoir, and establishing a hydraulic fracturing finite element model of a casing-cement ring-perforation hole in cluster-reservoir matrix containing natural fractures.

3 Claims, 5 Drawing Sheets

(58) Field of Classification Search
CPC ........... F05D 2270/703; F05D 2270/70; E21B 2200/20; E21B 2200/00
See application file for complete search history.

NUMERICAL SIMULATION AND PARAMETER OPTIMIZATION METHOD FOR VOLUMETRIC FRACTURING OF UNCONVENTIONAL DUAL MEDIUM RESERVOIR

CROSS REFERENCE TO THE RELATED APPLICATIONS

This application is based upon and claims priority to Chinese Patent Application No. 201910223536.2, filed on Mar. 22, 2019, the entire contents of which are incorporated herein by reference.

TECHNICAL FIELD

The present invention relates to the technical field of oil and gas development, in particular to a numerical simulation and parameter optimization method for volumetric fracturing of an unconventional dual medium reservoir.

BACKGROUND

For a long time, energy supply and demand contradictions in China have become prominent. The dependence on oil and natural gas has increased year by year. In 2017, The dependence on foreign oil in China reached 67.4%, and natural gas reached 39.4%, which greatly exceeded the internationally recognized warning line and seriously threatened China's energy security. According to a global survey conducted by the US Energy Information Administration (EIA), China's shale gas reserves are 36.1 trillion cubic meters, ranking first in the world. As a typical unconventional natural gas resource, China has great potential for shale gas resource development. The shale gas reservoirs in China are generally buried deep, especially the Wufeng-Longmaxi Formation in the Sichuan Basin has an average depth of over 3,000 m, and some have reached 5000 m. It presents typical features such as complex geological structure, lamellation development, high stress and high strength, such that the reservoir construction pressure is as high as 80-110 MPa. According to the development practice of the shallow layer (vertical depth of 2000-3000 m) in the first three years of the Fuling shale gas field, it is found that: in the multi-cluster perforation volumetric fracturing process a horizontal well in a unconventional dual-medium reservoir, the reservoir fracturing pressure and the fracture extension pressure are high, often accompanied with the serious accidents because the construction pressure exceeds a limit and the reservoir is thus not opened by fracturing, and the fractures in the near-well zone are complex and cause a sand blockage.

In recent years, domestic and foreign scholars have carried out a large number of laboratory experiments and numerical simulation studies on the fracture initiation and expansion behaviors of complex fractures during volumetric fracturing of unconventional dual-medium reservoir gas. However, these studies assume that after multi-cluster perforation clustering, a main fracture is formed at each perforation cluster, and the main fractures of each perforation cluster are expanded together. The researches focus on the stress field and fracture morphology under the mutual interference between the main fractures of various clusters. Few scholars have studied the dilation, expansion, intersection and bifurcation behaviors of multiple fractures in the near-well zone from perforation fracturing of perforations in the perforation cluster. Meanwhile, unconventional dual-medium reservoirs usually contain large amounts of natural fractures and are of typical dual-media systems. In the existing hydraulic fracture expansion model, the unconventional dual-medium reservoir is generally treated as a conventional single medium or even an impermeable medium, which will affect the calculation accuracy of the fluid pressure distribution near the main fractures during the fracturing process, and further affect the fracture initiation and expansion behaviors after the hydraulic fractures encounter with natural fractures and when the peripheries of the main fractures are not connected with natural fractures.

SUMMARY

An objective of the present invention is to overcome the defects of the prior art. In consideration of the scientific problems that a volumetric fracturing construction pressure of an unconventional dual-medium reservoir is high and hydraulic fractures in most perforation clusters have not been effectively expanded, and in consideration of the mutual coupling of the stress field, seepage field and flow field in fractures in the unconventional dual-medium reservoir, a fracture viscoelastic-plastic damage model and grid units of an explicit time integral are constructed, discrete natural fracture generation programs and fracture unit embedding programs are developed, a complex fracture alternate expansion model for dual-medium seepage-stress-damage coupling of the unconventional dual-medium reservoir is created, and the mechanism of influences of the natural fracture layout and parameters, perforation parameters, liquid type and displacement lifting methods on rejection, attraction, bifurcation and intersection of multiple hydraulic fractures and natural fractures in the cluster is revealed. Perforation modes and perforation parameters in clusters, construction parameters and engineering geological conditions that are conducive to reducing near-well friction drag, and expanding and connecting in series a plurality of fractures to form a dominant main fracture are found out. Furthermore, a numerical simulation and parameter optimization method for volumetric fracturing of an unconventional dual-medium reservoir is provided, which comprises the following steps:

S1, establishing a mathematical model of hydraulic fracture expansion of volumetric fracturing in the unconventional dual-medium reservoir, and developing a dual-medium seepage-stress coupling model and algorithm based on an explicit time integral solution strategy;

S2, for the deformation of fractures, in consideration of the friction effect between fracture surfaces, developing a fracture viscoelastic damage model and grid units of the explicit time integral;

S3, simulating random intersection and bifurcation of hydraulic fractures encountering with natural fractures by adopting a method of embedding zero-thickness fracture units in the grid boundary of the unconventional reservoir matrix;

S4: compiling a borehole-perforation-multi-fracture fracturing fluid competition distribution program to realize a dynamic distribution process of fracturing fluid among a plurality of fractures (including perforation holes and fractures);

S5, establishing a numerical model for complex multi-fracture fracturing and competitive expansion during volumetric fracturing of the unconventional reservoir, and compiling a complex multi-fracture alternate expansion program;

S6, establishing a grid model of a casing-cement ring-perforation in cluster-reservoir matrix containing natural fractures based on actual reservoir engineering geological conditions, making researches on rupture positions of the perforations in the cluster, the opening of natural fractures, pressure distribution in the near-well zone and the perforation holes and the like under the conditions of different perforation modes (including spiral perforations, directed perforations and surface-oriented perforations), perforation parameters (including aperture, penetration depth, hole density and phase angle), wellbore parameters (including hole drift angle and azimuth) and reservoir rock mechanics properties (including brittleness—ductility and acid damage), and optimizing perforation modes, perforation parameters, construction parameters (including displacement, fluid volume and pumping procedures) in the initial stage of fracturing and physical and chemical properties of fracturing fluid, and the like;

S7, coupling natural fractures and multiple hydraulic main fractures based on actual reservoir engineering geological conditions with respect to unconventional reservoir matrix-natural fracture dual media, carrying out numerical simulation of the alternate extension of a plurality of hydraulic main fractures encountering with natural fractures in the near-wellbore zone in the cluster, making researches on the law of rejection, attraction, bifurcation and intersection of alternate expansion of hydraulic fractures and natural fractures near the well hole, and optimizing the volumetric fracturing construction process parameters, such as perforation modes and parameters, liquid type (i.e., physical and chemical properties of fracturing liquid) and displacement lifting modes; and S8, coupling natural fractures and multiple hydraulic main fractures based on actual reservoir engineering geological conditions with respect to unconventional reservoir matrix-natural fracture dual media, carrying out numerical simulation of the alternate extension of a plurality of hydraulic main fractures encountering with natural fractures in the multi-cluster section, making researches on the law of rejection, attraction, bifurcation and intersection among a plurality of hydraulic main fractures and between the hydraulic main fractures and natural fractures, calculating evolutional law of a fracture network under different construction parameters so as to form a maximum fracture area, and optimizing the volumetric fracturing construction process parameters.

In the step S2, the fracture viscoelastic-plastic damage model and grid units of an explicit time integral is constructed: for the deformation of fractures, in consideration of the friction effect between fracture surfaces, a new cohesive force constitutive model is developed to describe deformation and damage behaviors of fracture units; a fracture viscoelastic-plastic damage model which has zero thickness and takes the friction effect of the fracture surfaces into consideration is constructed; the fracture initiation and expansion of the fractures obey the Traction-separation damage criterion; with respect to the problem that the finite element calculation is not easy to converge during the crossing and bifurcation expansion of the fractures, an explicit time integral finite element equation formula of a triangular fracture unit is derived, and a calculation program of the fracture units is compiled; the upper and lower surface nodes of the fracture grid unit structure have fluid pressure degrees of freedom (including a matrix pore pressure and a fracture pore pressure) and displacement degrees of freedom to calculate the deformation of the fracture surface and the fluid loss of the fracturing fluid; an intermediate layer node has only a fluid pressure degree of freedom to calculate the flow of fluid within the fractures.

In the step S3, the intersection and bifurcation expansion numerical values of hydraulic fractures encountering with natural fractures is realized: a discrete natural fracture network is generated according to the distribution law of natural fractures in the reservoir by using Monte Carlo method; a finite element geometric model containing discrete natural fractures is established to perform grid generation on the entire study area, and a program to embed a fluid-solid coupling fracture unit among all units is developed; fracture units are inserted to the boundaries of all grids, and hydraulic fractures and natural fractures are uniformly characterized with viscoelastic-plastic damage fracture units; therefore, the hydraulic fractures can be extended along the boundary of any unit to achieve multi-fracture intersection and bifurcation expansion behaviors, without re-dividing grids; the fracture units that characterize hydraulic fractures and natural fractures are essentially the same, only differing in the size of mechanical parameters and hydraulic parameters; the fracture units and the unconventional dual medium reservoir matrix unit are coupled by means of common nodes.

The present invention has the following advantages:

1. the present invention has the following advantages: the entire study area is subjected to grid generation, and the program to embed a fluid-solid coupling fracture unit among all units is developed; fracture units are inserted to the boundaries of all grids, and hydraulic fractures and natural fractures are uniformly characterized with viscoelastic-plastic damage fracture units. Therefore, the hydraulic fractures can be extended along the boundary of any unit to achieve multi-fracture intersection and bifurcation expansion behaviors, without re-dividing grids;

2. in consideration of the influences of natural fractures in unconventional dual-medium reservoirs near perforation clusters, the perforation hole seepage-stress-damage coupling model in the volumetric fractured perforation cluster of the unconventional dual-medium reservoir is established, and the fracture initiation mechanism of multiple fractures in the perforation cluster of the unconventional dual-medium reservoir is revealed;

3. in consideration of the mutual coupling of natural fractures and multiple hydraulic main fractures, the competitive expansion mechanism of rejection, attraction, bifurcation and intersection of multiple hydraulic main fractures and natural fractures in the perforation cluster is revealed.

BRIEF DESCRIPTION OF THE DRAWINGS

The following drawings are intended to illustrate and explain the present invention, and do not limit the scope of the present invention, wherein.

DETAILED DESCRIPTION OF THE EMBODIMENTS

The present invention will be further described below with reference to the accompanying drawings, but the protection scope of the present invention is not limited to the followings.

Figure 1:
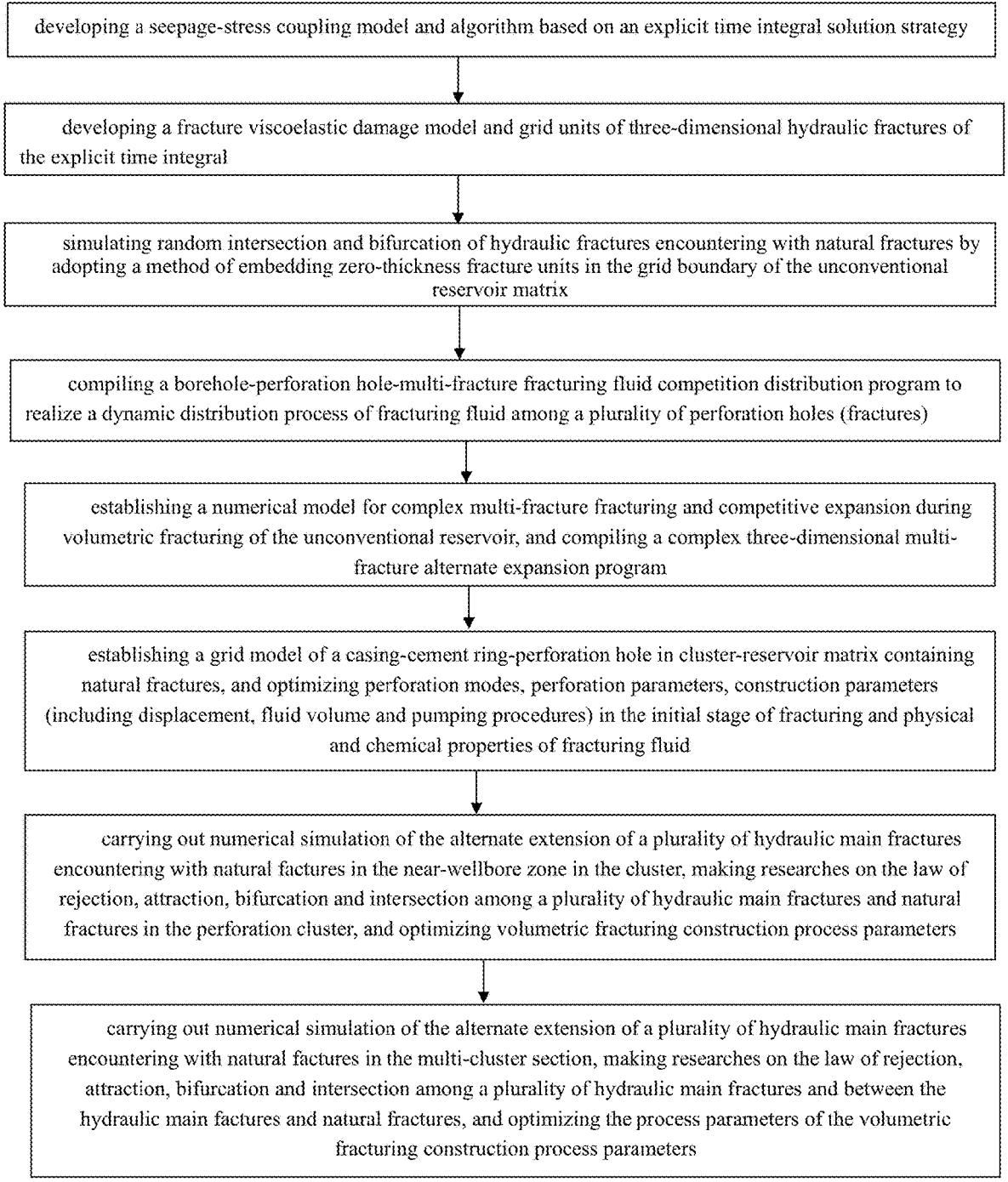
FIG. 1 is a flow diagram of a numerical simulation and construction method of the present invention.
Figure 2:
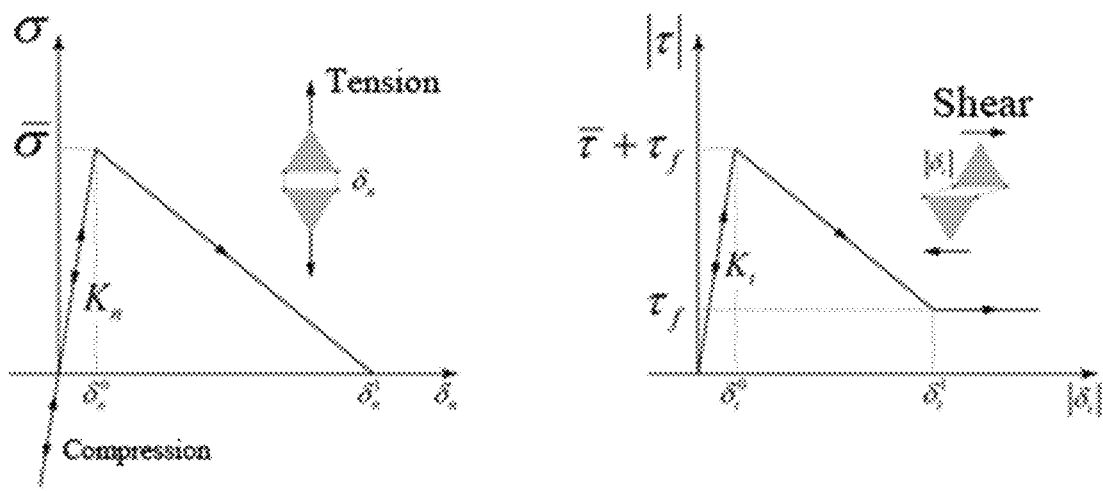
FIG. 2 is a schematic diagram of a viscoelastic damage constitutive model.
Figure 3:
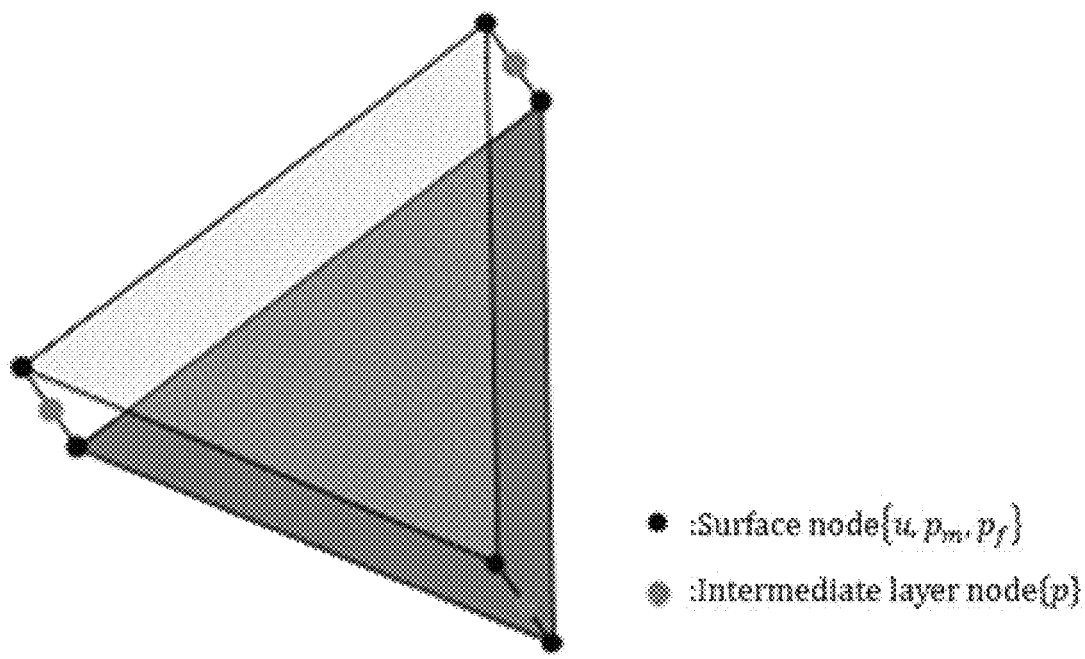
FIG. 3 is a structural schematic diagram of fracture grid units.
Figure 4:
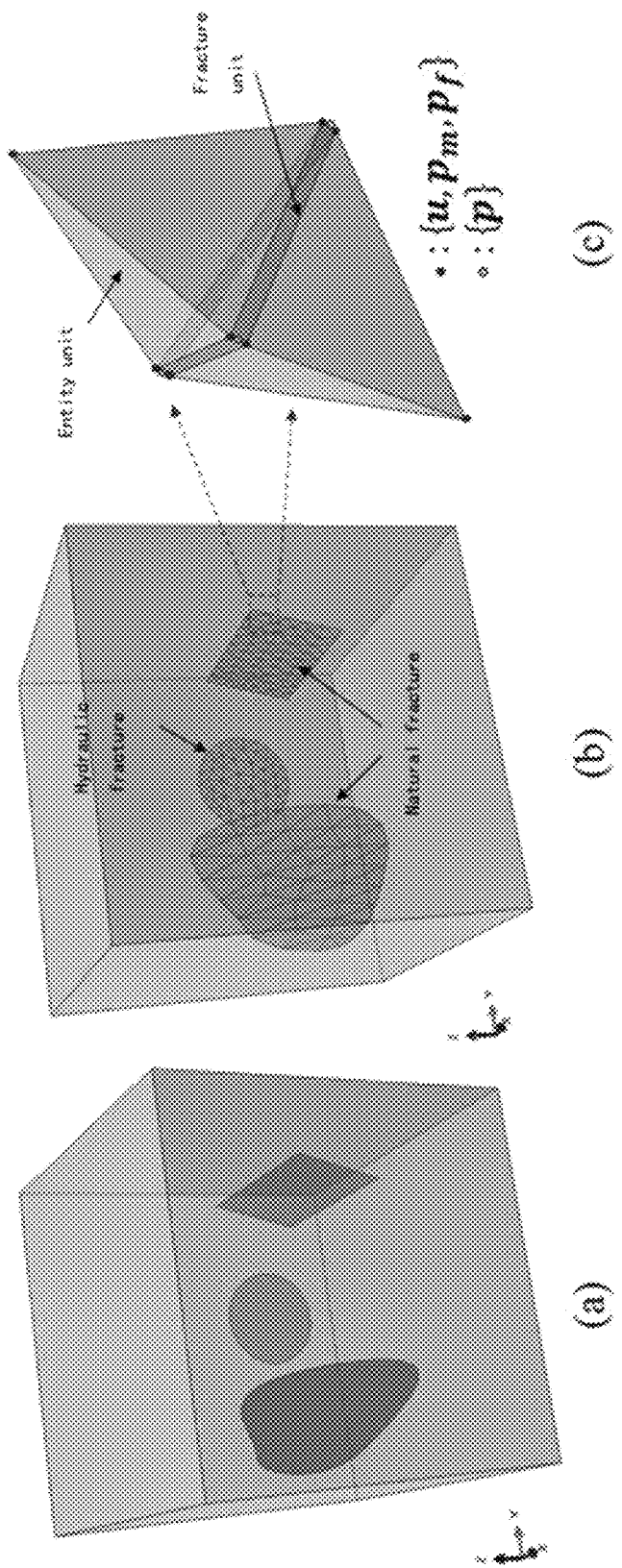
FIG. 4 is a schematic diagram of reservoir natural fracture distribution, finite element grid segmentation strategy, as well as matrix and fracture units coupled through common nodes.
Figure 5:
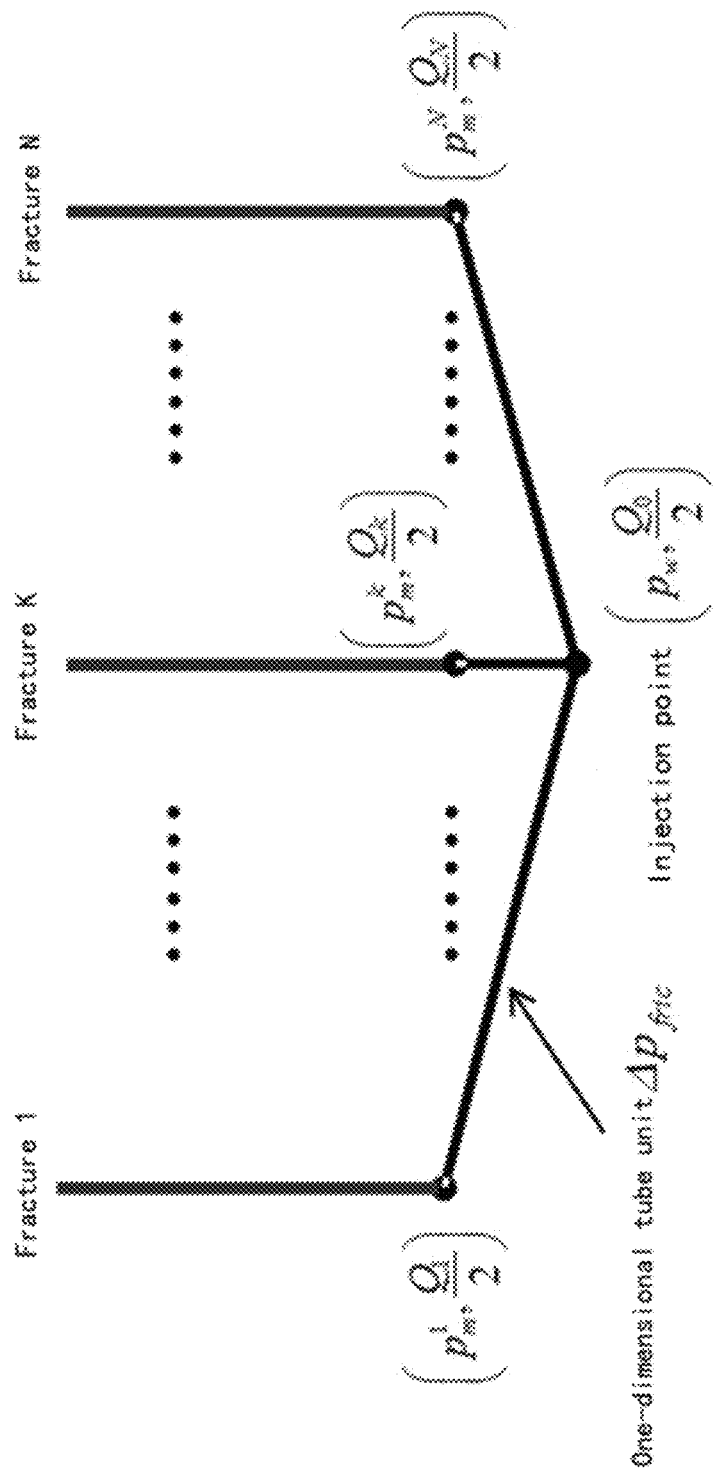
FIG. 5 is a schematic diagram of a borehole-perforation hole-multi-fracture fracturing fluid competition distribution model.
Figure 6:
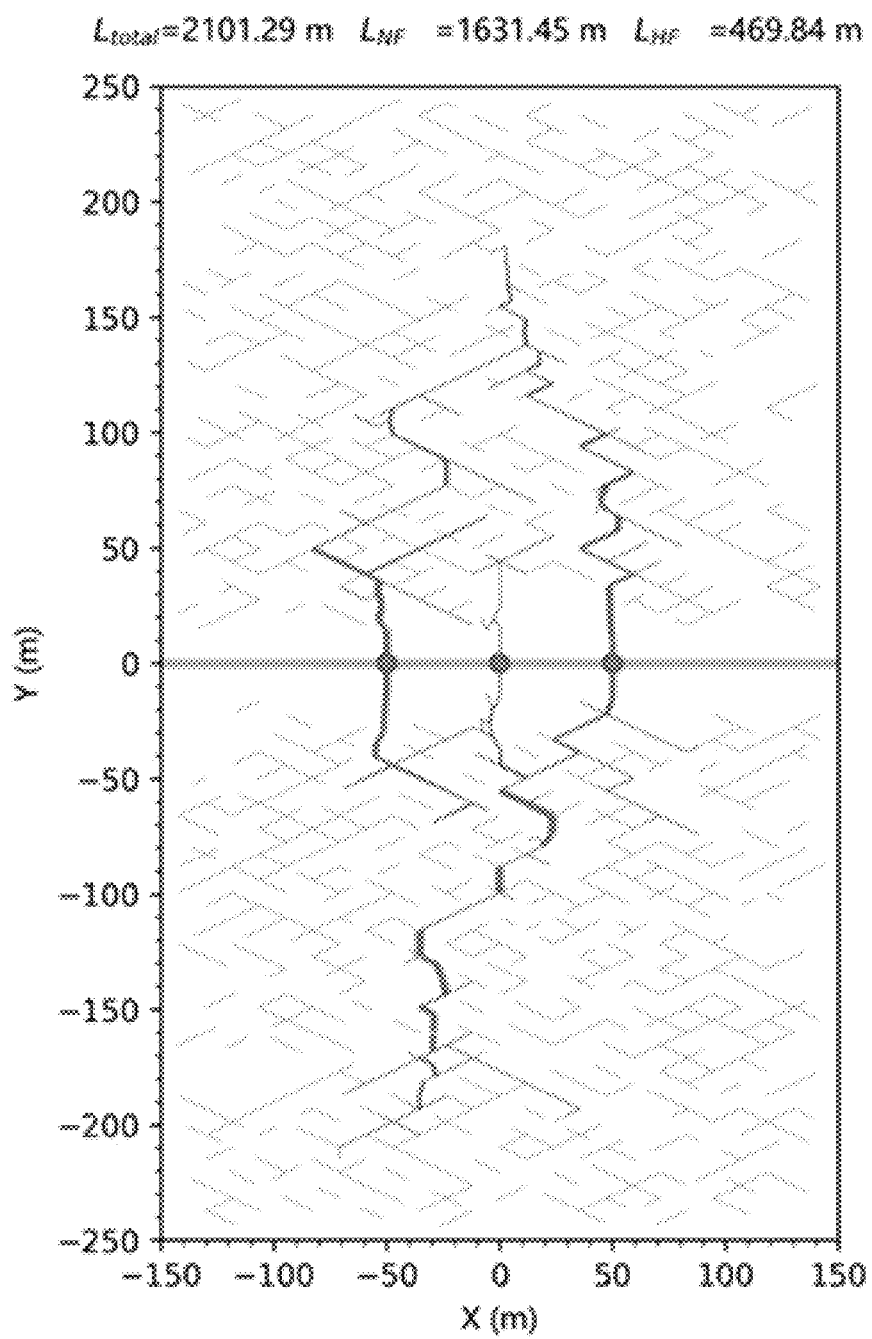
FIG. 6 shows calculation results of a complex fracture network of segmented multi-cluster fracturing.

As shown in FIGS. 1-6, a numerical simulation and parameter optimization method for volumetric fracturing of an unconventional dual-medium reservoir comprises the following steps:

S1, establishing a mathematical model of hydraulic fracture expansion, analyzing an induced stress field model of fracture extension, and developing a dual-medium seepage-stress coupling model and algorithm based on an explicit time integral solution strategy, that is, deriving a stress balance equation, a geometric equation and a Biot effective stress model of an unconventional dual-medium reservoir matrix skeleton according to the Biot's theory of pore elasticity, and establishing a matrix skeleton deformation control equation of the unconventional dual-medium reservoir. It is assumed that the pore fluid flow in the unconventional dual-medium reservoir obeys the Darcy's law, and a seepage control equation for the unconventional dual-medium reservoir is derived in combination with the mass conservation equation. A mathematical model for fluid-solid coupling of the unconventional dual-medium reservoir based on the explicit time integral solution strategy is established in combination with the fluid and stress boundary conditions of the perforations in segmented multi-cluster fracturing clusters of a horizontal well. Grid separation is performed on the geometry model of the fractured reservoir, and unknown displacement and pressure degrees of freedom are introduced on the nodes of the units. A finite element equation of the fluid-solid coupling mathematical model of the unconventional dual-medium reservoir is derived. An explicit time integral calculation program of the fluid-solid coupling unit is developed;

S2, for the deformation of fractures, in consideration of the friction effect between fracture surfaces, developing a fracture viscoelastic damage model and grid units of the explicit time integral, that is: for the deformation of fractures, in consideration of the friction effect between fracture surfaces, a new cohesive force constitutive model is developed to describe deformation and damage behaviors of fracture units; a fracture viscoelastic-plastic damage model which has zero thickness and takes the friction effect of the fracture surfaces into consideration is constructed, wherein the fracture initiation and expansion of the mechanical constitutive model (as shown in FIG. 2, $\bar{\sigma}(\bar{\tau}+\tau_f)$ is a tensile strength (shear strength) of the reservoir rock, MPa; $\tau_f$ is a frictional stress of the fracture surface, MPa; $K_n(K_t)$ is an interfacial stiffness coefficient in a tensile (shear) state; $\delta_n^1(\delta_t^1)$ is an initial damage displacement, m; $\delta_n^1(\delta_t^1)$ is a complete damage displacement) obeys the Traction-separation damage criterion; with respect to the problem that the finite element calculation is not easy to converge during the crossing and bifurcation expansion of the fractures, an explicit time integral finite element equation formula of a triangular fracture unit is derived, and a calculation program of the fracture units is compiled; the upper and lower surface nodes of the fracture grid unit (as shown in FIG. 3) have fluid pressure degrees of freedom (including a matrix pore pressure and a fracture pore pressure) and displacement degrees of freedom to calculate the deformation of the fracture surface and the fluid loss of the fracturing fluid; an intermediate layer node has only a fluid pressure degree of freedom to calculate the flow of fluid within the fractures;

S3, simulating random intersection and bifurcation of hydraulic fractures encountering with natural fractures by adopting a method of embedding zero-thickness fracture units in the matrix grid boundary of the unconventional reservoir, that is: a discrete natural fracture network is generated according to the distribution law of natural fractures in the reservoir by using the Monte Carlo method, a finite element geometric model containing discrete natural fractures is established (as shown in FIG. 4a) to perform grid segmentation on the entire study area by using three-dimensional tetrahedral grids, and a program to embed a fluid-solid coupling fracture unit among all units is developed; fracture units are inserted to the boundaries of all grids (as shown in FIG. 4b), and hydraulic fractures and natural fractures are uniformly characterized with viscoelastic-plastic damage fracture units. Therefore, the hydraulic fractures can be expanded along the boundary of any unit to achieve multi-fracture intersection and bifurcation expansion behaviors, without re-dividing grids; the fracture units that characterize hydraulic fractures and natural fractures are essentially the same, only differing in the size of mechanical parameters and hydraulic parameters; the fracture units and the unconventional dual-medium reservoir matrix unit are coupled by means of common nodes (as shown in FIG. 4c, $\{u, p_m, p_f\}$ are surface nodes; and $\{p\}$ is intermediate layer node);

S4, compiling a borehole-perforation hole-multi-fracture fracturing fluid competition distribution program to realize a dynamic distribution process of fracturing fluid among a plurality of fractures (including perforation holes and fractures), that is, during the fracturing process, the fracturing fluid enters multiple hydraulic fractures from the wellbore through the perforation holes (as shown in FIG. 5, $Q_k$ is the flow of the fracturing fluid into the k-th fracture, m³/s; $p_w^k$ is a fluid pressure of the k-th fracture at a position close to a casing, Pa; $\Delta p_{fric}^k$ is a pressure drop at the perforation cluster of the k-th fracture); the flow rate of the fracturing fluid entering each perforation is dynamically related to the fracture initiation and expansion of the fractures outside the perforation; according to the Kirchhoff's law, the flow of fluid in the wellbore is regarded as a one-dimensional flow problem, and the wellbore flow and pressure balance equation is established; according to the law of conservation of mass, the total mass of the fluid injected into the fractures is equal to the sum of the mass of the fluid in all the fractures and the normal fluid loss, and the mass conservation equation of the fluid in the plurality of fractures is established; the wellbore flow and pressure balance equations and the mass conservation equations of the fluids in multiple fractures are combined to establish a wellbore-perforation hole-multi-fracture fracturing fluid competition distribution model; by developing one-dimensional tubes unit to describe the frictional resistance of the fracturing fluid flowing through the perforations, a plurality of one-dimensional tube units are combined at one end in a manner of FIG. 5 by common injection points, thereby realizing the dynamic distribution process of fracturing fluid between multiple perforations and fractures;

S5, establishing a numerical model for complex multi-fracture fracturing and competitive expansion during volumetric fracturing of the unconventional reservoir, and compiling a complex multi-fracture alternate expansion program, that is, discrete programming of the established finite element equations in the spatial and temporal domains is solved, and the explicit time integration scheme is used to overcome the problem of convergence difficulties caused by strong nonlinearity in the process of hydraulic fracture expansion (especially complex fracture expansion): the solid deformation dynamics equation is discretized in the time domain using an integral time difference integration scheme, and the fluid dynamics equation is discretized in the time domain using a forward time difference integral scheme; meanwhile, the artificial damping technology (which can improve the time integration step) is combined with the multi-core parallel computing technology to improve the solution efficiency of the model;

S6, establishing a grid model of a casing-cement ring-perforation hole in cluster-reservoir matrix containing natural fractures based on actual reservoir engineering geological conditions, making researches on rupture positions of the perforations in the cluster, the opening of natural fractures, pressure distribution in the near-well zone and the perforation holes and the like under the conditions of different perforation modes (spiral perforations, directed perforations, and surface-oriented perforations), perforation parameters (including aperture, penetration depth, hole density and phase angle), wellbore parameters (including hole drift angle and azimuth) and reservoir rock mechanics properties (including brittleness—ductility and acid damage), and optimizing perforation modes, perforation parameters, construction parameters (including displacement, fluid volume and pumping procedures) in the initial stage of fracturing and physical and chemical properties of fracturing fluid, and the like, that is: according to the process characteristics of a multi-cluster fracturing of a horizontal well in the unconventional dual-medium reservoir, based on actual wellbore size, perforation parameters of single-cluster perforations, rock mechanics parameters of the unconventional dual-medium reservoir and their constitutive models, in consideration of structural characteristics of casing-cement ring-perforation hole in cluster, a geometric model of perforations in segmented multi-cluster fractured cluster of the horizontal well in the unconventional dual-medium reservoir is established, and then discretized;

S7, based on "the numerical simulation model of perforation seepage-stress-damage coupling in the volumetrically fractured perforation cluster of the unconventional dual-medium reservoir", in consideration of the expansion of a single hydraulic main fracture from the perforation only, performing numerical simulation of the alternate extension of the hydraulic main fractures and bedding interface/natural fractures of the unconventional dual-medium reservoir, revealing the non-planar expansion mechanism of hydraulic fractures in the case of encountering bedding and high-angle natural fractures of the unconventional dual-medium reservoir, and finding out the construction process parameters and engineering geological conditions that form these three intersecting modes; in the case of ignoring the natural fractures in the unconventional dual-medium reservoir, and only simulating the competitive expansion process of the repulsion, attraction and intersection of multiple hydraulic main fractures in the cluster; making researches on the influences of perforation parameters, liquid type and displacement lifting methods on parameters such as non-planar fracture morphology, flow distribution, and pressure drop in fractures; revealing the mechanism of perforation parameters and fracturing construction parameters on the non-balanced expansion of fractures and the mutual interference of multi-fracture induced stress fields; coupling natural fractures and multiple hydraulic main fractures of the unconventional dual-medium reservoir with respect to unconventional reservoir matrix-natural fracture dual-medium reservoir matrix-natural fracture dual medium; in consideration of different natural fracture layout and geometric parameters, perforation modes and parameters, liquid type and displacement lifting methods, and the like, carrying out numerical simulation of alternate extension of a plurality of hydraulic main fractures encountering with natural fractures in the near-wellbore zone in the cluster; making researches on the pattern of multiple hydraulic fractures in the process of being away from the wellbore, where hydraulic fractures and the natural fractures encounter, alternately extend and are separated from each other, as well as the non-planar fracture morphology of multi-fracture mutual interference, the distribution of flow in the wellbore-fracture, the net pressure in fractures and the variation law of the stress field between the fractures; and optimizing the perforation modes, parameters, liquid type and displacement lifting modes and other volume fracturing construction process parameters;

S8, coupling natural fractures and multiple hydraulic main fractures based on actual reservoir engineering geological conditions with respect to unconventional reservoir matrix-natural fracture dual media, carrying out numerical simulation of the alternate extension of a plurality of hydraulic main fractures encountering with natural fractures in the multi-cluster section, making researches on the law of rejection, attraction, bifurcation and intersection of a plurality of hydraulic main fractures and natural fractures in perforation clusters, and optimizing the volumetric fracturing construction process parameters such as the liquid type and displacement lifting mode; that is: a grid model of a casing-cement ring-perforation hole in cluster-unconventional dual-medium reservoir matrix containing natural fractures is established according to the fractal description of natural fractures of the reservoir; inserting explicit time-integrated fracture units to the boundaries of all the grids of the model by using a complied fracture element embedding program; the displacement of the natural fracture surfaces is calculated by a mathematical model of the contact force and friction on the natural fracture surfaces; in consideration of the shear slip and expansion behaviors of natural fractures, the maximum tensile stress criterion is used to judge the fracturing of the pores in the cluster; the numerical simulation model of hole seepage-stress-damage coupling in the dual-medium volumetrically fractured perforation cluster is established by using plastic damage to simulate the fracture expansion, and the fracture initiation and expansion simulation of multiple fractures in the cluster is realized (as shown in FIG. 6, the transverse axis refers to a fracture width, m; the longitudinal axis refers to an accumulative fracture length, m; $L_{total}$ refers to a total length of fractures, m; $L_{NF}$ refers to a length of the natural fracture, m; $L_{HF}$ is the length of hydraulic fracture, m); rupture positions of the perforation holes in the cluster, the opening of natural fractures, pressure distribution in the near-well zone and the perforations and the like are researched under the conditions of different perforation modes, perforation parameters, wellbore parameters and reservoir rock mechanics properties, and perforation modes, perforation parameters, construction parameters in the initial stage of fracturing and physical and chemical properties of fracturing fluid, and the like are optimized.

What is claimed is:

1. A numerical simulation and parameter optimization method for volumetric fracturing of an unconventional dual medium reservoir, comprising the following steps:

S1, establishing a mathematical model of hydraulic fracture propagation of the volumetric fracturing in the unconventional dual-medium reservoir, and developing a seepage-stress coupling model and algorithm based on an explicit time integral solution strategy;

S2, for a deformation of fractures, considering a friction effect between fracture surfaces, developing a fracture viscoelastic damage model and grid units of an explicit time integral;

S3, simulating a random intersection and bifurcation of hydraulic fractures encountering with natural fractures by a method for embedding zero-thickness fracture units in a grid boundary of an unconventional reservoir matrix;

S4, compiling a borehole-perforation-multi-fracture fracturing fluid competition distribution program to realize a dynamic distribution process of a fracturing fluid among a plurality of fractures;

S5, establishing a numerical model for complex multi-fracture fracturing and competitive expansions during the volumetric fracturing of the dual medium unconventional reservoir, and compiling a complex multi-fracture alternate expansion program;

S6, establishing a grid model of a casing-cement ring-perforation in a cluster-reservoir matrix containing the natural fractures based on actual reservoir engineering geological conditions, and optimizing perforation modes, perforation parameters, construction parameters in an initial stage of fracturing and physical and chemical properties of the fracturing fluid;

S7, coupling the natural fractures and a plurality of hydraulic main fractures based on the actual reservoir engineering geological conditions with respect to unconventional reservoir matrix-natural fracture dual media, carrying out a numerical simulation of an alternate extension of the plurality of hydraulic main fractures encountering with natural fractures in the near-wellbore zone in a cluster, and optimizing volumetric fracturing construction process parameters of perforation modes and parameters, a liquid type and a displacement lifting mode; and S8, coupling the natural fractures and the plurality of hydraulic main fractures based on the actual reservoir engineering geological conditions with respect to the unconventional reservoir matrix-natural fracture dual media, carrying out the numerical simulation of the alternate extension of the plurality of hydraulic main fractures encountering with the natural fractures in a multi-cluster section, and optimizing process parameters of the volumetric fracturing construction process parameters.

2. The numerical simulation and parameter optimization method for the volumetric fracturing of the unconventional dual medium reservoir according to claim 1, wherein in the step S2, for the deformation of the fractures, in consideration of the friction effect between the fracture surfaces, a cohesive force constitutive model is developed to describe deformation and damage behaviors of fracture units; a fracture viscoelastic-plastic damage model having a zero thickness and taking the friction effect of the fracture surfaces into consideration is constructed; a fracture initiation and an expansion of the fractures obey a Traction-separation damage criterion; an explicit time integral finite element equation formula of a triangular fracture unit is derived, and a calculation program of the fracture units is compiled, so as to converge a finite element calculation during a crossing and bifurcation expansion of the fractures; an upper surface node and a lower surface node of a fracture grid unit structure have a fluid pressure degree of freedom and displacement degrees of freedom to calculate the deformation of the fracture surfaces and a fluid loss of the fracturing fluid; an intermediate layer node has only the fluid pressure degree of freedom to calculate a flow of fluid within the fractures.

3. The numerical simulation and parameter optimization method for the volumetric fracturing of the unconventional dual medium reservoir according to claim 1, wherein, in the step S3, a discrete natural fracture network is generated according to a distribution rule of the natural fractures in the unconventional dual medium reservoir by using a Monte Carlo method; a finite element geometric model containing discrete natural fractures is established to perform grid generation on an entire study area, and a program to embed fluid-solid coupling fracture units among all units is developed; fracture units are inserted to boundaries of all grids, and the hydraulic fractures and the natural fractures are uniformly characterized with viscoelastic-plastic damage fracture units; the hydraulic fractures are expanded along a boundary of any unit to achieve multi-fracture intersection and bifurcation expansion behaviors, without re-dividing grids; the fracture units characterizing hydraulic fractures and natural fractures are essentially identical, only differing in the size of mechanical parameters and hydraulic parameters; the fracture units and an unconventional dual medium reservoir matrix unit are coupled by common nodes.

* * * * *